United States Patent
Ramappa et al.

(10) Patent No.: US 8,716,155 B2
(45) Date of Patent: May 6, 2014

(54) METHOD TO ENHANCE CHARGE TRAPPING

(75) Inventors: Deepak A. Ramappa, Somerville, MA (US); Kyu-Ha Shim, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/610,322

(22) Filed: Sep. 11, 2012

(65) Prior Publication Data

US 2013/0005155 A1 Jan. 3, 2013

Related U.S. Application Data

(62) Division of application No. 12/640,760, filed on Dec. 17, 2009, now Pat. No. 8,283,265.

(60) Provisional application No. 61/139,008, filed on Dec. 19, 2008.

(51) Int. Cl.
*H01L 21/469* (2006.01)

(52) U.S. Cl.
USPC ........... 438/791; 438/763; 438/778; 438/783; 257/637

(58) Field of Classification Search
USPC ................... 438/791, 763, 778, 783; 257/637
See application file for complete search history.

(56) References Cited

U.S. PATENT DOCUMENTS

| 2005/0006696 A1* | 1/2005 | Noguchi et al. | 257/316 |
| 2010/0096688 A1* | 4/2010 | Balseanu et al. | 257/324 |

* cited by examiner

*Primary Examiner* — Ha Tran T Nguyen
*Assistant Examiner* — Aaron Dehne

(57) ABSTRACT

Methods of improving charge trapping are disclosed. One such method includes forming an oxide-nitride-oxide tunnel stack and a silicon nitride layer on the oxide-nitride-oxide tunnel stack. This silicon nitride layer is implanted with ions. These ions may function as electron traps or as fields. The silicon nitride layer may be part of a flash memory device.

13 Claims, 7 Drawing Sheets

METHOD TO ENHANCE CHARGE TRAPPING

CROSS-REFERENCE TO RELATED APPLICATIONS

This application is a divisional of the patent application entitled "Method to Enhance Charge Trapping," filed Dec. 17, 2009 and assigned U.S. application Ser. No. 12/640,760, which claims priority to the provisional patent application entitled "Method to Enhance Charge Trapping," filed Dec. 19, 2008 and assigned U.S. application Ser. No. 61/139,008, the disclosures of which are hereby incorporated by reference.

FIELD

This invention relates to a method of charge trapping, and, more particularly, to the use of ion implantation to enhance charge trapping.

BACKGROUND

Ion implantation is a standard technique for introducing conductivity-altering impurities into semiconductor workpieces. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Flash memory is a type of computer memory that can be electrically erased and reprogrammed. This sort of memory is used in memory cards and universal serial bus (USB) flash drives, for example. A specific type of flash memory is referred to as NAND (Not And). This uses tunnel injection for writing and tunnel release for erasing. Tunneling alters the placement of electrons within the flash memory. Charge carriers may be injected into a conductor through a thin insulator layer to program the flash memory. Charge carriers also may be released from the conductor through a thin insulator layer to erase the flash memory.

FIG. 1 is a cross-sectional diagram of a flash stack. The flash stack 300 includes a first oxide layer 301, a first nitride layer 302, and a second oxide layer 303 that make up the oxide-nitride-oxide (ONO) tunnel stack 310 or ONO tunneling dielectric. The first nitride layer 302 may be approximately 70 nm in thickness. The flash stack 300 further includes a second nitride layer 304 that functions as a charge storage layer. This second nitride layer 304 may be between approximately 1200 to 2000 Angstroms in thickness. In one instance, this second nitride layer 304 is $Si_xN_y$ wherein the x and y values can vary according to $Si_xN_y$ deposition plasma ratios. $Si_xN_y$ may be abbreviated SiN. A third oxide layer 305 functions as a blocking oxide and a poly gate 306 is disposed on top. The flash stack 300 acts as a gate of the device which has a source 307 and a drain 308, both of which may be n+ and are disposed in a channel 309. The channel 309 may be a p-well.

In a molecule, energy bands exist based on energy levels of the electrons because the electrons of each atom will act upon other adjacent electrons. Thus, the individual atomic orbital states will split into energy bands in a molecule. A band gap, for example, is the energy difference between the valence band and the conduction band. This band gap is an energy region where no electron orbitals are found. Electrons are able to jump between these two bands across the band gap by acquiring or losing energy. The width of any band gap or band is dependent on the properties of the atomic orbitals.

The second nitride layer 304 typically has a band gap of approximately 2.1 eV. The first nitride layer 302 may have substantially similar properties. At least the second nitride layer 304 acts as a tunneling barrier as this has a significantly higher band gap than an oxide layer. To program the flash stack 300, a positive voltage is applied to the poly gate 306 to tunnel electrons from the channel 309 or other locations into the second nitride layer 304. Electrons that go into the second nitride layer 304 may, in theory, stay there indefinitely because there is no path for the electrons to escape. To erase the flash stack 309, a negative voltage is applied to the poly gate 306 and holes tunnel and recombine with electrons in the second nitride layer 304. In another instance, the electrons may tunnel and drain to ground.

If a positive voltage is applied to the poly layer 306 it induces a field under the gate region in the channel 309. This is called a program cycle. If this applied voltage is higher than the required threshold voltage for a given device, the electrons from the source 307 will transfer to the drain region 308. In the process the electrons also will tunnel through the ONO tunnel stack 310 toward the top of the poly gate 306 and get trapped in the second nitride layer 304. The accumulation of charge in the second nitride layer 304 will, thus, provide and store a value of "1." This value is stored until erased by a refreshing process using a voltage of the opposite sign. The retention of this charge in the second nitride layer 304 for an infinite duration is the essence of the "charge-trap flash." The ability of the second nitride layer 304 to retain the tunneled electrons is a factor in the performance and reliability of the flash stack 300. With the advent of scaling the layers of the ONO tunnel stack 310 have become extremely thin. This allows electrons to slowly diffuse back into the channel 309 or into the ONO tunnel stack 310. Thus, with time the charge trap layers may lose enough electrons (charge) through the ONO tunnel stack 310 that the flash stack 300 does not hold the value of "1" anymore. Therefore, there is a need to enable better charge retention capacity of the second nitride layer 304.

In a similar fashion as explained above, if the desired value to be stored is "0" then an appropriate negative voltage is applied to the poly gate 306. This enables holes from the channel 309 to tunnel through the ONO tunnel stack 310 and get stored in the second nitride layer 304. Then the flash memory will store a value of 0. The same retention capacity of the second nitride layer 304 as explained above works for holes as well as electrons. The voltages applied to the poly gate 306 may be between approximately 10-15 V and scaled appropriately with the thicknesses, materials, and technology node of the flash stack 300. A positive voltage is applied for tunneling electrons and negative voltage for tunneling holes.

To erase the stored value in a stack a voltage of opposite sign is applied to the poly gate 306 and the electrons and holes are passivated by charges of opposite type. Repeatedly performing the program and erase functions degrades the integrity of the ONO tunnel stack 310 and also the second nitride layer 304. This type of damage further reduces charge retention capacity of the second nitride layer 304 and makes the layers of the ONO tunnel stack 310 leaky. Therefore there is a need to enhance the charge storage capability of the second nitride layer 304.

Feature sizes in conventional flash memory, including NAND flash memory, have reached scaling limits. It is becoming more difficult to shrink these types of memory. Some tunneling oxide layers, such as the first oxide layer 301, may be less than approximately 12 Angstroms in thickness.

Such low thicknesses may mean that the ONO tunnel stack 310 has become leaky and not in the Fowler-Nordheim (FN) tunneling regime where interactions between charge carriers and atoms affect tunneling, but rather in the direct tunneling regime. Therefore, NAND flash memory manufacturers are implementing a "charge-trap" integration scheme. The present method to enable charge trap flash memory is to deposit film layers in the flash stack 300, including the second nitride layer 304, that have a higher band gap. Such a method has limitations. Deposited films show an increase in band gap when the ratio of Si in the SiN is increased. But there is an intrinsic upper value to this ratio increase because beyond a certain limit the dielectric breakdown strength of the nitride will be compromised due to "k" centers in the SiN and the crystal structure of the SiN. Furthermore, the etch rate and etch selectivity of this layer will increase, which leads to difficulty of etching the flash stack 300. Accordingly, there is a need in the art for an improved method of charge trapping, and, more particularly, of using ion implantation to enhance charge trapping for flash memory.

SUMMARY

According to a first aspect of the invention, a method is provided. The method comprises forming an oxide-nitride-oxide tunnel stack. A silicon nitride layer is formed on the oxide-nitride-oxide tunnel stack and the silicon nitride layer is implanted.

According to a second aspect of the invention, an apparatus is provided. The apparatus comprises an oxide-nitride-oxide tunnel stack and a silicon nitride layer with a first surface and a second surface. The second surface is disposed on the oxide-nitride-oxide tunnel stack. The silicon nitride layer has an implant region containing implant species. An oxide layer is disposed on the first surface of the silicon nitride layer.

According to a third aspect of the invention, a method is provided. The method comprises depositing a silicon nitride layer having a first surface and a second surface. A first doped region is formed proximate the second surface during the deposition. The first surface of the silicon nitride layer is implanted.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
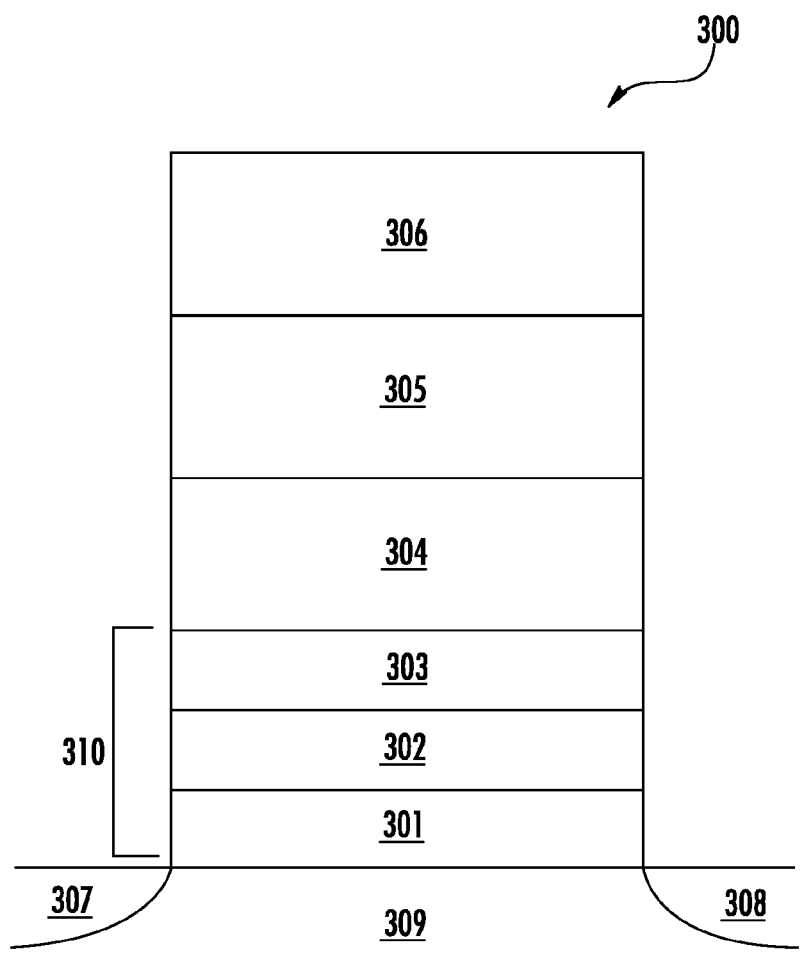
FIG. 1 is a cross-sectional diagram of a flash stack.
Figure 2:
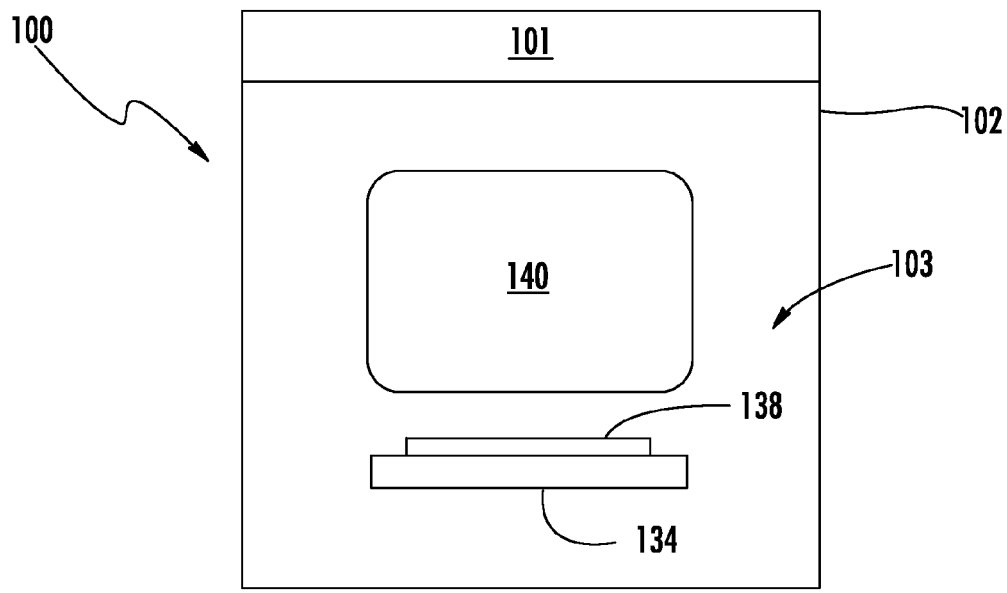
FIG. 2 is a block diagram of a plasma doping system.
Figure 3:
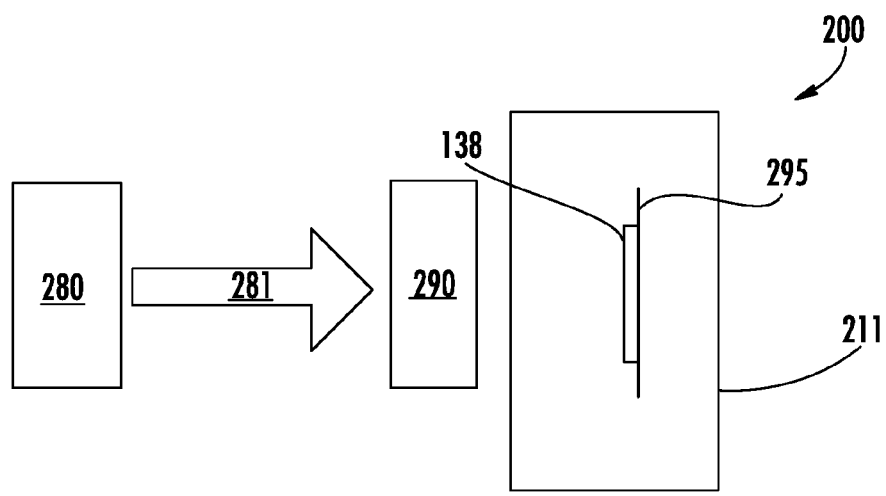
FIG. 3 is a block diagram of a beam-line ion implanter.

The process disclosed in the embodiments herein may be performed using, for example, a plasma doping system 100 or a beamline ion implanter 200. FIG. 2 is a block diagram of a plasma doping system 100. FIG. 3 is a block diagram of a beamline ion implanter 200. Those skilled in the art will recognize that the plasma doping system 100 and the beamline ion implanter 200 are each only one of many examples of differing plasma doping systems and beamline ion implanters. Furthermore, those skilled in the art will recognize apparatuses, such as other plasma immersion or plasma flood tools, that also may be used for implanting a species. The implants disclosed in the embodiments herein may be performed in a cluster or stacked configuration tool. Other flash stack 300 designs or other memory or integrated circuit designs also may benefit from the embodiments disclosed herein.

Turning to FIG. 2, the plasma doping system 100 includes a process chamber 102 defining an enclosed volume 103. The process chamber 102 or workpiece 138 may be cooled or heated by a temperature regulation system (not illustrated). A platen 134 may be positioned in the process chamber 102 to support a workpiece 138. The platen 134 also may be cooled or heated by a temperature regulation system (not illustrated). Thus, the plasma doping system 100 may incorporate hot or cold implantation of ions in some embodiments. In one instance, the workpiece 138 may be a semiconductor wafer having a disk shape, such as, in one embodiment, a 300 mm diameter silicon wafer. However, the workpiece 138 is not limited to a silicon wafer. The workpiece 138 may be clamped to a flat surface of the platen 134 by electrostatic or mechanical forces. In one embodiment, the platen 134 may include conductive pins (not shown) for making connection to the workpiece 138. The plasma doping system 100 further includes a source 101 configured to generate a plasma 140 from an implant gas within the process chamber 102. The source 101 may be an RF source or other sources known to those skilled in the art. The platen 134 may be biased. This bias may be provided by a DC or RF power supply. The plasma doping system 100 may further include a shield ring, a Faraday sensor, or other components. In some embodiments, the plasma doping system 100 is part of a cluster tool, or operatively-linked process chambers 102 within a single plasma doping system 100. Thus, numerous process chambers 102 may be linked in vacuum.

In operation, the source 101 is configured to generate the plasma 140 within the process chamber 102. In one embodiment, the source 101 is an RF source that resonates RF currents in at least one RF antenna to produce an oscillating magnetic field. The oscillating magnetic field induces RF currents into the process chamber 102. The RF currents in the process chamber 102 excite and ionize the implant gas to generate the plasma 140. The bias provided to the platen 134, and, hence, the workpiece 138, will accelerate ions from the plasma 140 toward the workpiece 138 during bias pulse on periods. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth.

Turning to FIG. 3, a block diagram of a beamline ion implanter 200 is illustrated. Again, those skilled in the art will recognize that the beamline ion implanter 200 is only one of many examples of beamline ion implanters. In general, the beamline ion implanter 200 includes an ion source 280 to generate ions that are extracted to form an ion beam 281, which may be, for example, a ribbon beam or a spot beam. The ion beam 281 may be mass analyzed and converted from a diverging ion beam to a ribbon ion beam with substantially parallel ion trajectories in one instance. The beamline ion implanter 200 may further include an acceleration or deceleration unit 290 in some embodiments.

An end station 211 supports one or more workpieces, such as workpiece 138, in the path of the ion beam 281 such that ions of the desired species are implanted into the workpiece 138. In one instance, the workpiece 138 may be a semiconductor wafer having a disk shape, such as, in one embodiment, a 300 mm diameter silicon wafer. However, the workpiece 138 is not limited to a silicon wafer. The end station 211 may include a platen 295 to support the workpiece 138. The end station 211 also may include in one embodiment a scanner (not shown) for moving the workpiece 138 perpendicular to the long dimension of the ion beam 281 cross-section, thereby distributing ions over the entire surface of workpiece 138.

The ion implanter 200 may include additional components known to those skilled in the art such as automated workpiece handling equipment, Faraday sensors, or an electron flood gun. It will be understood to those skilled in the art that the entire path traversed by the ion beam is evacuated during ion implantation. The beamline ion implanter 200 may incorporate hot or cold implantation of ions in some embodiments.

Figure 4:
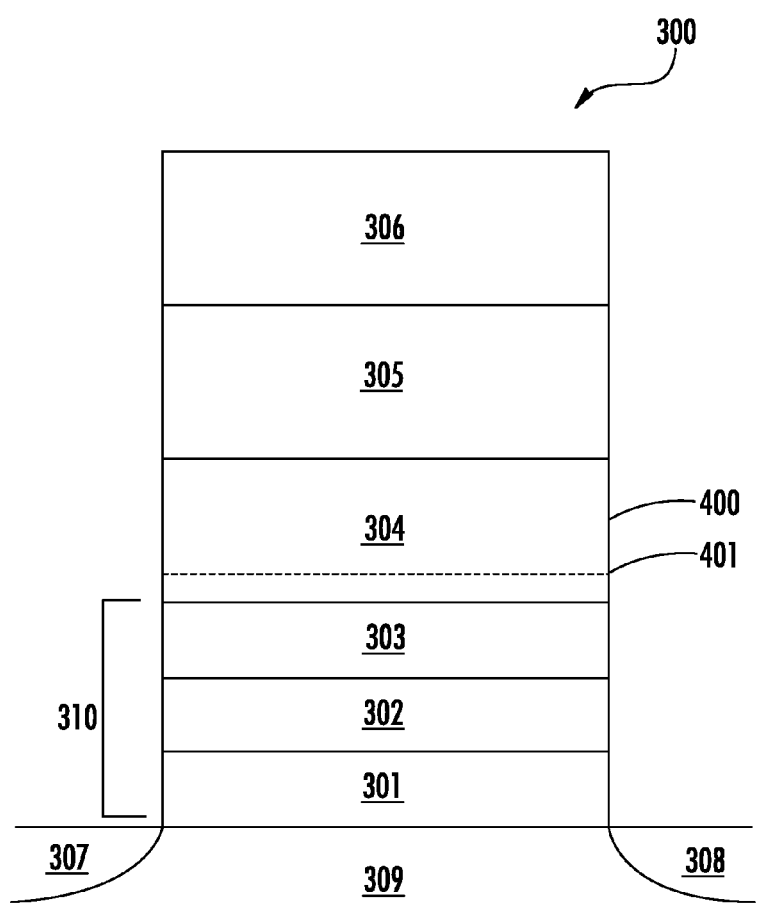
FIG. 4 is a cross-sectional diagram of a flash stack that has been implanted with ions in a first embodiment.

FIG. 4 is a cross-sectional diagram of a flash stack that has been implanted with ions in a first embodiment. A first oxide layer 301, second oxide layer 303, and third oxide layer 305 with good intrinsic integrity in terms of, such as, breakdown strength or number of interface traps may allow a flash stack 300 to perform properly. A high density of electron trap sites in the second nitride layer 304 also may allow a flash stack 300 to perform properly. In this embodiment, the second nitride layer 304 has been implanted using, for example, a plasma doping system 100 or a beamline ion implanter 200. The implanted region 400 is in the second nitride layer 304 above the dotted line 401. In one embodiment, a gap between the implanted region 400 and the second oxide layer 303 is formed so that the second oxide layer 303 is not implanted or doped. This is avoids damage to the ONO tunnel stack 310. Implanting the ONO tunnel stack 310 will create damage that will make the second oxide layer 303 have electron traps or cause it to be leaky.

The implant breaks bonds within the SiN of the second nitride layer 304. The broken bonds create "electron traps," or mid-band gap states, within the band gap of the SiN in the second nitride layer 304. These electron traps will allow storage of tunneling electrons within the second nitride layer 304. The presence of the electron traps will require the tunneling electrons to have a certain potential to diffuse or leak out of the second nitride layer 304.

In one embodiment, the third oxide layer 305 is formed after the formation of the implanted region 400. This third oxide layer 305 may be a low-temperature deposited oxide that is formed using, for example, a plasma-enhanced chemical vapor deposition (PECVD) process. The poly gate 306 also may be formed after formation of the implanted region 400.

The second nitride layer 304 may be implanted with ions or atoms of, for example, Si, Ge, Sn, N, C, O, F, He, Ar, Xe, B, $BF_2$ (or other combinations of B and F), P, other halogens, other dopants, other metallic elements or compounds, or other species known to those skilled in the art. The implant energies depend on the species being implanted. In one instance the implant energy is selected so as to implant the second nitride layer 304 only to a particular depth, in FIG. 4 illustrated by dotted line 401. The dose rate may be varied to change the density of the defects or broken bonds created in the second nitride layer 304. A faster dose rate may increase the number of defects formed. The bond between the Si and N in SiN has a bond energy of approximately 3.1 eV, so continual bombardment at a high dose rate may help break the bond. The dose may be between approximately 1E14 and 1E17 in one instance.

A cold implant may be performed in a first instance. This will increase the density of electron traps formed in the second nitride layer 304. Cold temperatures may allow any defect states in the amorphous network of the second nitride layer 304 to be retained. These cold temperatures also may create more defects for a given implant dose compared to, for example, a room temperature implant dose. Thus, this may enable more defect states to be created at a lower dose. For example, a cold implant may be performed between approximately −400° C. to 20° C., and, more particularly, between approximately −100° C. to 20° C.

A hot implant may be performed in a second instance. This will enable bonding of implanted dopant atoms or ions with the broken bonds in the SiN in the second nitride layer 304. First, increased temperature within the second nitride layer 304 will provide energy to release N atoms that have been broken off from the SiN in the second nitride layer 304. These N atoms may be released as, for example, a gas. Second, energy also may be provided to allow dopants to bond with the SiN in place of the N using this broken bond. Third, energy may be provided to anneal any damage caused by the implant such as the damage at the end of range (EOR). Fourth, this energy may be provided to perform an anneal at least partially simultaneously with the implant and avoid or reduce the need for a separate anneal step after implantation. For example, a hot implant may be performed between approximately 60° C. to 700° C., and, more particularly, between approximately 60° C. to 300° C.

Cold or hot implants also may increase the band gap of the SiN, which may improve performance or scaling. Changing the material component ratios in a material affects the bandgap, so changing the Si to N ratio in SiN may change the bandgap. If an appropriate type of dopant, such as B, is implanted, then, for example, a Si—B—N network can form during the implant. This can have a higher band gap than the SiN layer.

Figure 5:
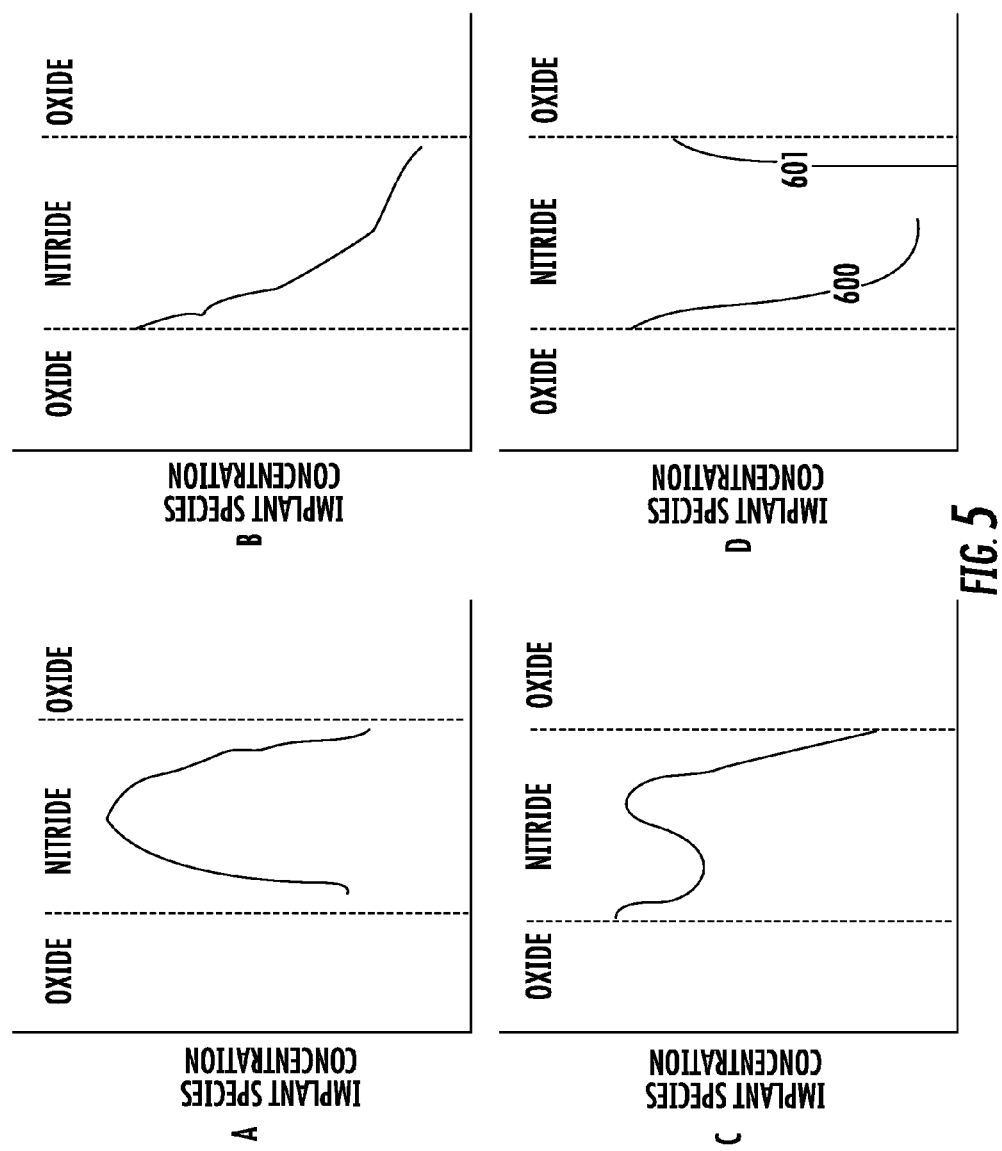
FIG. 5A-5D are implant profiles that may be used for electron trap creation.

FIG. 5A-5D are implant profiles that may be used for electron trap creation. Different implant profiles will have different effects on the electron traps that are created in the second nitride layer 304. As seen in FIGS. 5A-5C, the implant profile may, for example, have a peak concentration at the surface of the second nitride layer 304, around the center of the second nitride layer 304, or may have a bimodal distribution. In FIG. 5D, a B dopant profile 600 and F dopant profile 601 are illustrated. In this instance the B profile will form a charge barrier or field. The F profile will passivate the interface between the second nitride layer 304 and the second oxide layer 303. Other profiles are possible and the embodiments of the process described herein are not solely limited to the profiles illustrated in FIGS. 5A-5D.

Besides forming electron traps, the implant species may form charge barriers or fields. Specifically, implanted dopants will create fields or charge barriers that will affect the flow of tunneling electrons through the lattice of the second nitride layer 304 because these dopants will have a charge due to their ionic state. Dopants will increase the dielectric field within the second nitride layer 304, which, in turn, will serve as a barrier to the tunneling electrons.

Figure 6:
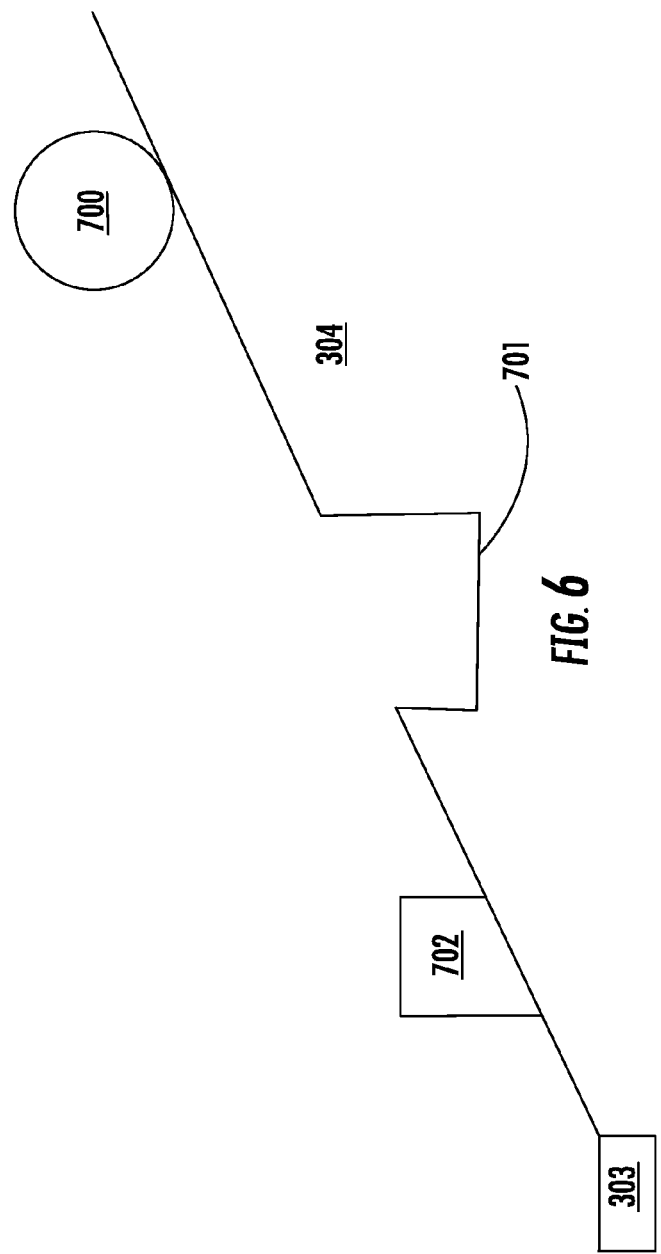
FIG. 6 is a simplified illustration of electron traps and fields.

FIG. 6 is a simplified illustration of electron traps and fields. One objective of the embodiments of the process described herein is to retain the electrons within the second nitride layer 304. For this simplified illustration, the tunneling electron 700 is rolling down a ramp through the second nitride layer 304 toward the second oxide layer 303. An electron trap 701 will retain the tunneling electron 700 while a field 702 will serve as a barrier to the tunneling electron 700. A tunneling electron 700 may overcome both an electron trap 701 and a field 702 with enough energy (i.e., increasing the angle of the ramp in FIG. 6), but both the electron trap 701 and field 702 help retain the tunneling electron within the second nitride layer 304.

An implant will damage the bonding network of the second nitride layer 304 and create defect states in the band structure. Defects may allow the existence of electron energy levels typically not found in the bonding network of the second nitride layer 304. This may be at least partly because bond distances between atoms may no longer be fixed or may be changed after the implant or because bonds are broken within the SiN. As electrons tunnel through the second nitride layer 304, the electron traps will trap the tunneled electrons and retain them. Electron traps may provide sites with lower Gibbs free energy that can capture electrons tunneling through. In one instance, multiple electrons may be captured at each electron trap and retained due to the clustering of multiple electron traps with unbonded states. This increases the margin of retention of charge within the second nitride layer 304 and stability of the second nitride layer 304.

Figure 7:
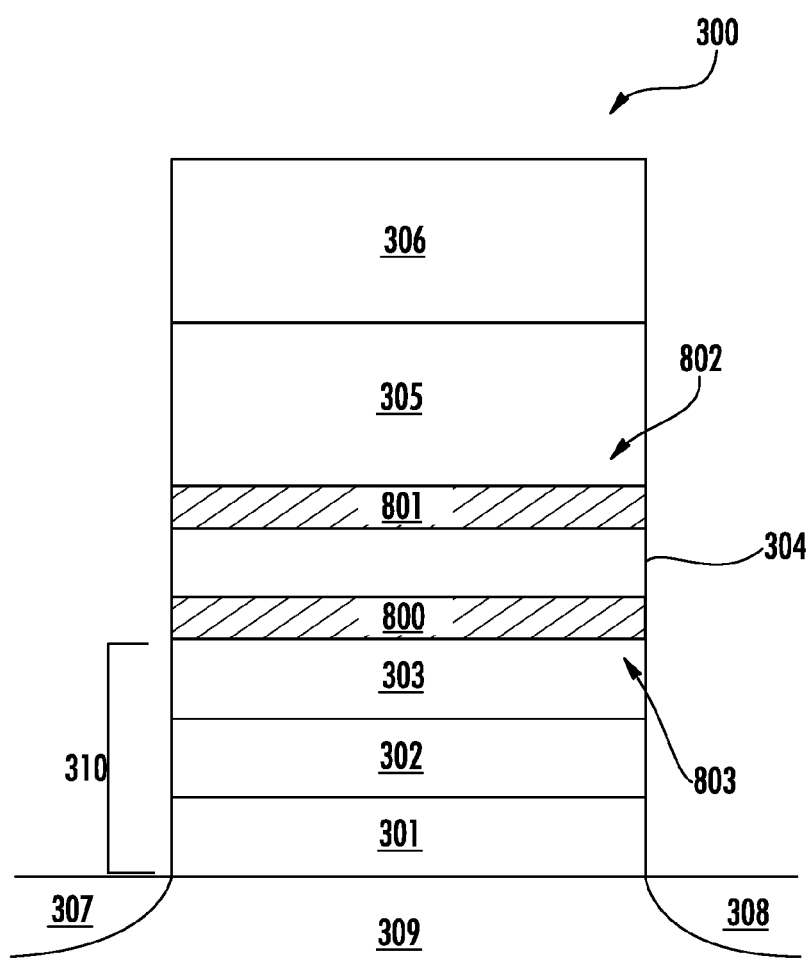
FIG. 7 is a cross-sectional diagram of a flash stack that has been implanted with ions in a second embodiment.

FIG. 7 is a cross-sectional diagram of a flash stack that has been implanted with ions in a second embodiment. The second nitride layer 304 is formed by deposition after formation of the second oxide layer 303 of the ONO tunnel stack 310. This second nitride layer 304 has a first surface 802 and a second surface 803. During deposition, a first doped region 800 may be formed near, for example, the second surface 803. The doped region 800 may be formed by, for example, changing the ratio or composition of deposition species during deposition. This first doped region 800 may be, for example, doped with P, but other dopants may be used. Thus, the deposition causes more dopant to be near the second surface 803 than the first surface 802. After the deposition of the second nitride layer 304 is complete, the second nitride layer 304 is implanted using, for example, a plasma doping system 100 or a beamline ion implanter 200 to form a second doped region 801. This second doped region 801 may be, for example, implanted with B, but other dopants may be used. This eliminates the need to carefully implant the second nitride layer 304 without implanting into the second oxide layer 303 because a shallower implant may be performed. This also may enable formation of multiple states or a double barrier layer, which may be an improved electron trapping layer and improve programming of the flash stack 300. In some embodiments, the second doped region 801 may overlap with the first doped region 800 without implanting into the second oxide layer 303.

Figure 8:
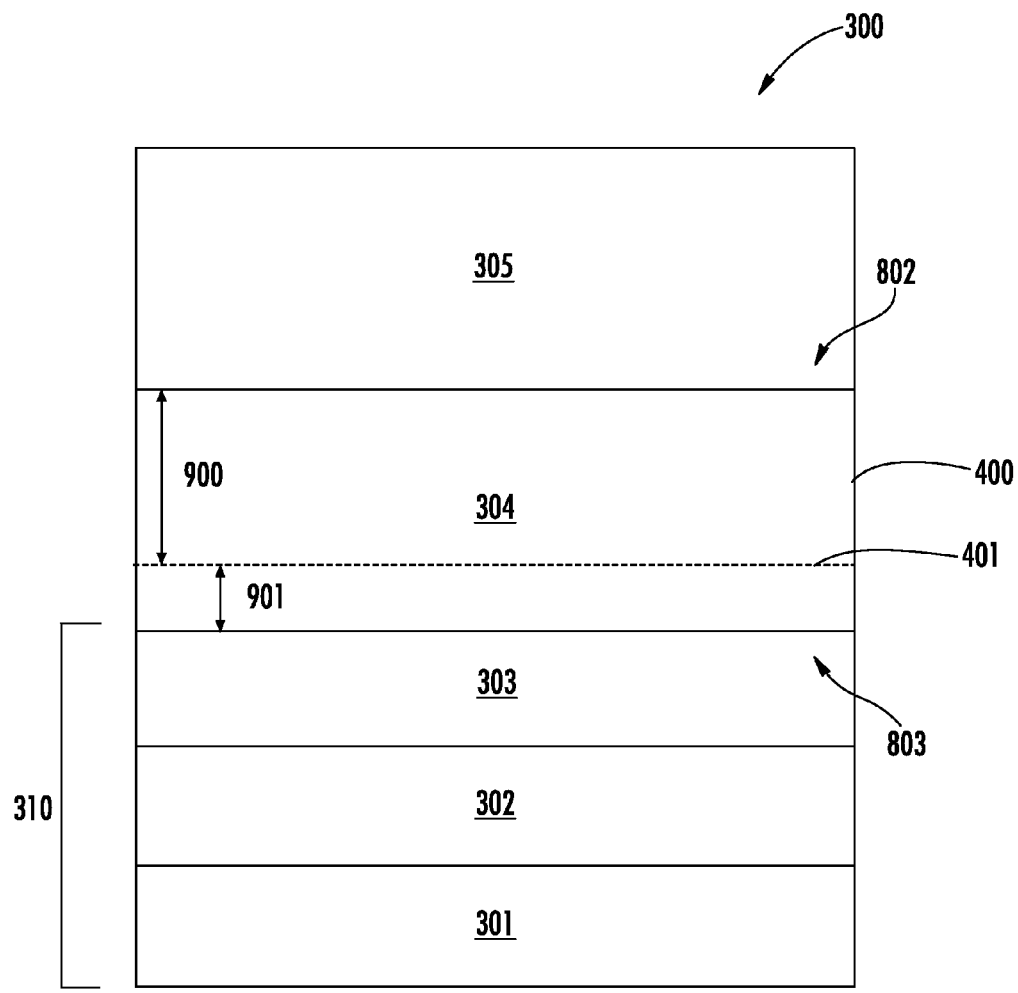
FIG. 8 is a cross-sectional diagram of a portion of a flash stack that has been implanted with ions in a third embodiment.

FIG. 8 is a cross-sectional diagram of a portion of a flash stack that has been implanted with ions in a third embodiment. In this embodiment, the second nitride layer 304 has been implanted using, for example, a plasma doping system 100 or a beamline ion implanter 200. This second nitride layer 304 has a second surface 803 that is on the second oxide layer 303 of the ONO tunnel stack 310 and a first surface 802. The implanted region 400 is above the dotted line 401. The implanted region 400 has an implant depth represented by the distance 900 below the first surface 802. The distance 900 in one embodiment is 75% of the distance between the first surface 802 and the second surface 803. In another embodiment, the distance 901 between the dotted line 401 and the second surface 803 is approximately 1 nm or approximately three monolayers of atoms. Of course, other implant depths and distances are possible, as is known to those skilled in the art. If the implant species in the implanted region 400 preferentially segregates into the second nitride layer 304, the distance 900 may be anywhere in the second nitride layer 304 above the second surface 803 because the implant species will segregate back into the second nitride layer 304.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method comprising:
   depositing a silicon nitride layer having a first surface and a second surface;
   forming a first doped region proximate said second surface during said depositing; and
   implanting said first surface of said silicon nitride layer, wherein said implanting is configured to implant said silicon nitride layer above said second surface, and
   wherein said implanting forms a second doped region that extends to a depth above said second surface, said second doped region occupying less than an entirety of said silicon nitride layer.

2. The method of claim 1, wherein said implanting comprises implanting a species selected from the group consisting of Si, Ge, Sn, N, C, O, F, He, Ar, Xe, P, B, $BF_2$, a molecule comprising of B and F, a halogen ion, and a metallic ion.

3. The method of claim 1, further comprising forming an oxide-nitride-oxide tunnel stack disposed on said second surface of said silicon nitride layer.

4. The method of claim 3, further comprising forming an oxide layer disposed on said first surface of said silicon nitride layer.

5. The method of claim 3, wherein said implanting is configured to implant said silicon nitride layer without implanting said oxide-nitride-oxide tunnel stack.

6. The method of claim 1, wherein said implanting forms electron traps in said silicon nitride layer.

7. The method of claim 1, wherein said implanting forms fields in said silicon nitride layer.

8. The method of claim 1, wherein said implanting occurs at a temperature between 60° C. and 300° C.

9. The method of claim 1, wherein said implanting occurs at a temperature between −100° C. and 20° C.

10. A method comprising:
    depositing a silicon nitride layer having a first surface and a second surface;
    forming a first doped region proximate said second surface during said depositing, wherein said first doped region includes more dopant near the second surface than the first surface; and
    implanting said first surface of said silicon nitride layer wherein said implanting is configured to implant said silicon nitride layer above said second surface,
    wherein said implanting forms a second doped region that extends to a depth above said second surface, and
    wherein said second doped region occupies less than an entirety of said silicon nitride layer.

11. The method of claim 10, further comprising forming an oxide-nitride-oxide tunnel stack disposed on said second surface of said silicon nitride layer.

12. The method of claim 11, further comprising forming an oxide layer disposed on said first surface of said silicon nitride layer.

13. The method of claim 11, wherein said implanting is configured to implant said silicon nitride layer without implanting said oxide-nitride-oxide tunnel stack.

* * * * *